United States Patent
Bronner et al.

[11] Patent Number: 5,876,788
[45] Date of Patent: Mar. 2, 1999

[54] HIGH DIELECTRIC TIO$_2$-SIN COMPOSITE FILMS FOR MEMORY APPLICATIONS

[75] Inventors: Gary Bela Bronner, Stormville; Stephan Alan Cohen, Wappingers Falls; David Mark Dobuzinsky, Hopewell Junction, all of N.Y.; Jeffrey Peter Gambino, Gaylordsville, Conn.; Herbert Lei Ho, New Windsor; Karen Popek Madden, Poughquag, both of N.Y.

[73] Assignee: International Business Machines Corporation, Armonk, N.Y.

[21] Appl. No.: 783,868

[22] Filed: Jan. 16, 1997

[51] Int. Cl.$^6$ ...................................................... B05D 5/12
[52] U.S. Cl. ...................... 427/81; 427/79; 427/248.1; 427/255.7; 427/397.7; 438/240; 216/6
[58] Field of Search .......................... 427/81, 79, 255.7, 427/248.1, 397.7, 579; 438/240; 216/6; 204/192.15

[56] References Cited

U.S. PATENT DOCUMENTS

| | | |
|---|---|---|
| 4,432,035 | 2/1984 | Hsieh et al. . |
| 4,464,701 | 8/1984 | Roberts et al. . |
| 4,882,649 | 11/1989 | Chen et al. .............................. 361/313 |
| 5,057,447 | 10/1991 | Paterson .................................... 437/43 |
| 5,362,632 | 11/1994 | Mathews . |

OTHER PUBLICATIONS

IBM Technical Disclosure Bulletin, vol. 26 No. 10B Mar. 1984.
IBM Technical Disclosure Bulletin, vol. 32 No. 4B Sep. 1989.
Barbour, J.C. "Thin–film reaction between Ti and Si$_3$N$_4$", *Appl. Phys. Lett.*, Apr. 1987, pp. 953–955.
Roberts, S., et al., "Selective Studies of Crystalline Ta$_2$O$_5$ Films", *Journal of the Electrochemical Society*, Jul. 1986, pp. 1405–1410.
Roberts, Stanley, et al. "Deposition and Properties of Ultra–Thin High Dielectric Constant Insulators".

*Primary Examiner*—Roy V. King
*Attorney, Agent, or Firm*—Scully, Scott, Murphy & Presser; Daryl K. Neff

[57] ABSTRACT

A method of fabricating a dielectric material useful in advanced memory applications which comprises a metal oxide such as TiO$_2$ or Ta$_2$O$_5$ interdiffused into a Si$_3$N$_4$ film is provided.

31 Claims, 5 Drawing Sheets

HIGH DIELECTRIC TIO₂-SIN COMPOSITE FILMS FOR MEMORY APPLICATIONS

DESCRIPTION

1. Field of the Invention

The present invention relates to a method of fabricating a composite dielectric structure useful in advanced memory applications and to semiconductor devices containing the same. The present invention also relates to a high dielectric composite material which comprises a metal oxide such as $TiO_2$ or $Ta_2O_5$ interdiffused into a silicon nitride film.

2. Prior Art

In the field of advanced memory applications, capacitance requirements for memory chips in the 1 Gb generation and subsequent generations are, and will continue to be, one of the key issues facing this technology. Within current memory technologies (be it stacked or trenched), the material most commonly employed as part of the storage node dielectric is silicon nitride ($Si_3N_4$). Typically, silicon nitride is deposited by using low pressure chemical vapor deposition (LPCVD) techniques to a thickness of about 4 to 5 nm. Such a material generally has an effective dielectric constant of approximately 6–7. However, as the technical field approaches the use of 1 Gb and higher memory cell densities, the effective dielectric constant of $Si_3N_4$ poses some series problems in terms of storing adequate charge. To offset this potential charge loss in future dynamic random access memory (DRAM) cells, it has been proposed to etch a deeper trench or to reduce the thickness of the silicon nitride layer. In the case of stacked capacitors, taller storage cylinders have been developed to overcome the potential charge loss.

None of the above proposals, however, are particularly desirable. For instance, etching a deeper trench would cause increased processing time and costs whereas scaling down the silicon nitride film tends to increase the leakage through the nitride film by tunneling.

As an alternative to employing silicon nitride in advance memory devices, higher dielectric constant materials containing metal oxides such as tantalum pentoxide ($Ta_2O_5$) and barium strontium titanate (BSTO) have been targeted for use in primary stacked capacitors. The use of higher dielectric constant materials is disclosed, for example, in U.S. Pat. No. 4,432,035 to Hsieh et al.; U.S. Pat. No. 4,464,701 to Roberts et al.; U.S. Pat. No. 5,362,632 to Mathews; IBM Technical Disclosure Bulletin, Vol. 26, No. 10B, March 1984 pp. 5527–5529, entitled "Formation of Thermally Stable $Ta_2O_5$ Films", Journal of Electrochemical Society: Solid-State and Technology, pp. 1405–1410, July 1986; IBM Technical Disclosure Bulletin, Vol. 32, No. 4B, September 1989, pp. 343–344 entitled "Process for Fabricating Small High Value Capacitors"; and the article to Roberts et al. entitled "Deposition and Properties of Ultra-Thin High Dielectric Constant Insulators", Emerging Semiconductor Technology, ASTM STP 960, D.C. Gupta & P. H. Langer, Eds. Amer. Soc. for Testing Materials, 1986, pp. 137–149.

Despite the current development of such high dielectric constant materials in advanced memory applications, those materials suffer the following drawbacks. First, when used as a thin film (<30 nm), the above mentioned high dielectric metal oxide materials exhibit high leakage currents. Secondly, the prior art high dielectric constant materials exhibit polarization fatigue which means that there is a decrease in ability to switch between "write" and "read" states. Moreover, the electrode formation used in conjunction with the prior art metal oxide-based dielectrics may become too costly as precious metals such as platinum and palladium are implemented.

Hence, there still exists a need to develop new dielectric materials for use in advanced memory applications that overcome the above drawbacks with prior art dielectric metal oxide-based materials while maintaining the robust nature of $Si_3N_4$.

SUMMARY OF THE INVENTION

One object of the present invention is to provide a method for fabricating a high dielectric composite structure for use in advanced memory applications.

Another object of the present invention is to provide a method of fabricating a new storage dielectric material which has a high dielectric constant while maintaining the robust qualities of $Si_3N_4$.

These as well as other objects are achieved by the method of the present invention which comprises, in one embodiment, the steps of:

(a) depositing a $Si_3N_4$ layer on top of a semiconductor substrate;

(b) forming a metal layer on said $Si_3N_4$ layer;

(c) annealing the composite formed in step (b) under conditions sufficient to form a metal silicide layer interdiffused into said $Si_3N_4$ layer; and (d) oxidizing the composite produced in step (c) under conditions sufficient to convert the metal silicide interdiffusion layer to a layer containing a metal oxide.

In accordance with this embodiment of the present invention, the annealing step should be conducted in non-oxidizing ambients such as He, Ne, Ar, Xe, $N_2$, $H_2$ and the like thereof. In an optional embodiment of the present invention, an annealing step followed by an in-situ oxidation step may be conducted prior to oxidizing the composite product.

In another embodiment of the present invention, a metal-nitride cap is provided on the metal layer prior to conducting the annealing step or during the annealing step if a $N_2$ ambient is used. The metal-nitride cap is removed prior to conducting said oxidizing step. In accordance with this embodiment of the present invention, the annealing step may be conducted in a wide variety of ambients.

The metals employed in the present invention are those metals which are known in the art as being capable of providing a metal oxide that has a dielectric constant of from about 10 to about 600. Suitable metals that can be employed in the present invention include, but are not limited to, Ti, Ta, Ba, Sr, Zr, Hf, Nb, V, Pb and Cr. Alloys of those metals such as BaSrTi and PbZrTi are also contemplated herein.

In yet another embodiment of the present invention, the semiconductor substrate is subjected to a cleaning step prior to depositing the $Si_3N_4$ layer. This is accomplished by first etching the semiconductor substrate under conditions sufficient to remove native oxides which are present in the semiconductor substrate and then subjecting the etched semiconductor substrate to a nitridizing process.

The present invention also provides a composite dielectric material which comprises a metal oxide such as $TiO_2$ or $Ta_2O_5$ interdiffused into a $Si_3N_4$ film. The composite dielectric material of the present invention, which is prepared in accordance with the method defined hereinabove, has a high dielectric constant.

The present invention also provides semiconductor devices such as capacitors, DRAM cells, memory chips and the like which contain the composite dielectric material of the present invention therein. Such devices are highly applicable for use in advance memory applications such as DRAM cells.

DETAILED DESCRIPTION OF THE PRESENT INVENTION

Figure 1A:
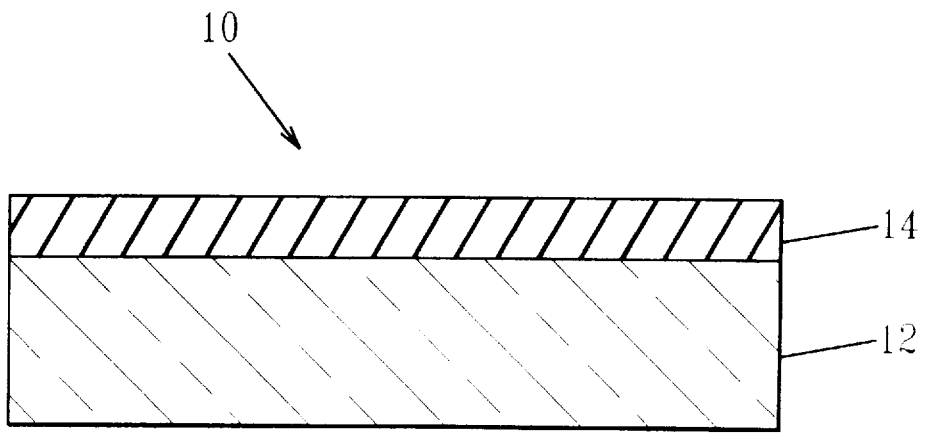
FIGS. 1(a)–(e) are cross-sectional views of the composite dielectric structure of the present invention after different stages of its production.

As stated above, one aspect of the present invention relates to a method of fabricating a composite dielectric structure for use in advanced memory applications which has a high dielectric constant while maintaining the robust quality of $Si_3N_4$.

The present invention will now be described by referring to the drawings herein. It is noted that like elements in the drawings have like numerals.

Reference is make to FIGS. 1(a)–(e) which show the various steps employed in the present invention in fabricating the composite dielectric structure. It should be noted that FIGS. 1(a)–(e) illustrate the embodiment wherein a metal-nitride cap is provided to the composite product however the detailed description provided hereinbelow also applies to the case wherein no metal-nitride cap is employed. Specifically, in FIG. 1(a), there is shown a cross-section view of the dielectric composite structure 10 after depositing a $Si_3N_4$ layer 14 on top of a semiconductor substrate 12.

$Si_3N_4$ layer 14 is deposited on top of semiconductor substrate 14 using deposition techniques well known to those skilled in the art. For example, chemical vapor deposition (CVD) techniques such as low pressure chemical vapor deposition (LPCVD) or plasma-enhanced chemical vapor deposition (PECVD) can be employed to deposit $Si_3N_4$ layer 14 on top of semiconductor substrate 12. Other deposition techniques besides those mentioned hereinabove may also be employed to deposit $Si_3N_4$ layer 14 on top of semiconductor substrate 12.

Typically, in the present invention, a thin layer of $Si_3N_4$ having a thickness of from about 50 to about 200 Å is deposited on top of semiconductor substrate 12. More preferably, deposited $Si_3N_4$ layer 14 has a thickness of from about 50 to about 100 Å.

Any semiconductor substrate well known to those skilled in the art can be used in the present invention. Generally, semiconductor substrate 12 is composed of silicon which can be doped or undoped. The thickness of semiconductor substrate 12 is not a critical limitation of the present invention. As such, the thickness may vary depending on the device being manufactured.

Semiconductor substrate 12 may be used as is, or it may be subjected to a cleaning step prior to depositing $Si_3N_4$ layer 14 thereon. When a cleaning step is employed in the present invention, semiconductor substrate 12 is first etched using techniques and conditions known in the art which are sufficient to remove native oxides that are present on the semiconductor substrate. After subjecting the semiconductor substrate to etching, the etched semiconductor substrate is nitrided under conditions and for a period of time which is effective for forming a pre-nitridated surface. Typically, nitridization is a rapid thermal process and occurs at a temperature of from about 700° to about 1000° C. for a period of time of from about 10 to about 120 secs. The ambient used for the nitridization is commonly an ammonia ($NH_3$) atmosphere, through nitrous oxide ($N_2O$) may also be used.

Figure 1B:
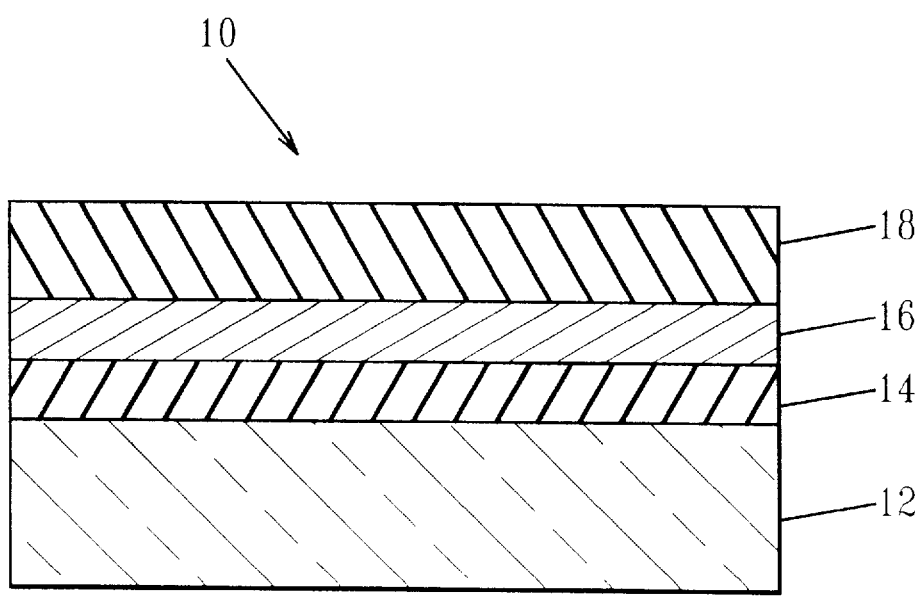

FIG. 1(b) shows the next two steps which are employed in the present invention. Specifically, after depositing $Si_3N_4$ layer 14 on semiconductor substrate 12, a metal layer 16 is formed on top of layer 14.

The metal layer 16 is formed by techniques well known to those skilled in the art. For example, metal layer 16 can be formed by sputtering, chemical vapor deposition and ion implantation. Of the aforementioned techniques, sputtering and chemical vapor deposition are highly preferred means for forming metal layer 16. In accordance with the present invention, metal layer 16 generally has a thickness of from about 50 to about 500 Å. More preferably, metal layer 16 has a thickness of from about 50 to about 300 Å.

The metal which may be used in forming metal layer 16 is a metal which is capable of providing a metal oxide which has dielectric constant of from about 10 to about 600. Suitable metals that can be employed in the present invention include, but are not limited to, Ti, Ta, Sr, Ba, Zr, Hf, Nb, V, Pb and Cr. These metals are employed in the present invention since their oxides exhibit (i) stability at high temperatures and in an $O_2$ ambient, (ii) insulator-like properties, and (iii) a high dielectric constant. Alloys of these metals such as BaSrTi and PbZrTi are also contemplated herein. Of the metals mentioned hereinabove, Ti and Ta are highly preferred, with, Ti being most preferred.

In the next step of the present invention, as shown in FIG. 1(b), a metal-nitride cap 18 is formed on metal layer 16. The metal-nitride cap 18 is formed using the same metal as well as the same techniques as described above for forming metal layer 16. The metal-nitride cap may be provided on the metal layer prior to annealing or during annealing if a $N_2$ ambient is used. The metal-nitride cap is employed in the present invention to prevent the oxidation of the metal which is to diffuse into the silicon nitride. Thus, it acts as a protective layer from the ambient. A preferred metal-nitride cap is TiN. The thickness of cap 18 is generally of from about 50 to about 1000 Å, more preferably from about 50 to about 500 Å.

Figure 1C:
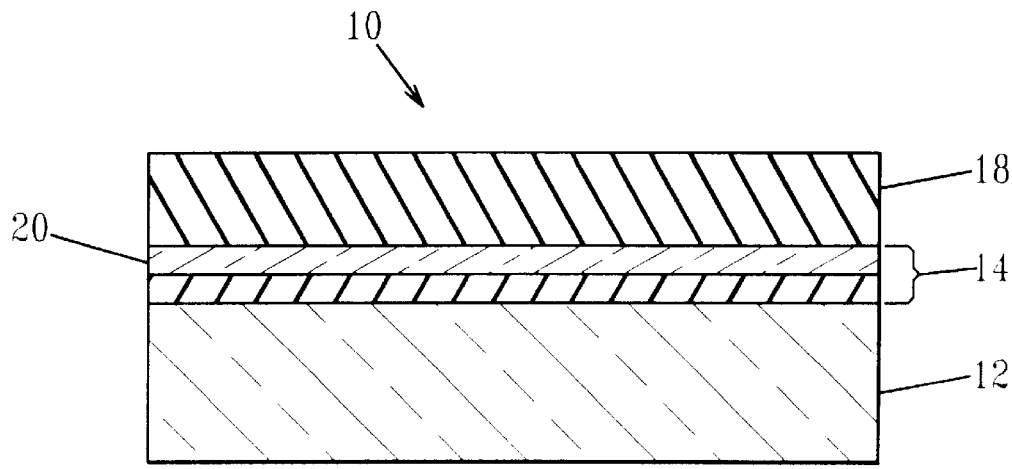

After providing cap 18 to metal layer 16, the composition shown in FIG. 1(b) is then annealed under conditions which are sufficient to form a metal silicide layer 20 interdiffused into $Si_3N_4$ layer 14. When Ti is employed as the metal layer, a titanium silicide; i.e., $Ti_5Si_3$, is interdiffused into $Si_3N_4$ layer 14. The annealed product containing metal silicide layer 20 is shown in FIG. 1(c).

The annealing step employed in the present invention is generally conducted in a $H_2/N_2$ gas mixture at a temperature of from about 400° to about 900° C. and for a period of time of from about 1 min. to about 1 hr. More preferably, the annealing step employed in the present invention is conducted at a temperature of from about 500° to about 800° C. for a period of time of from about 1 min. to about 1 hr. In addition to a $H_2/N_2$ gas mixture other ambients such as inert gas ambients or other nonoxidizing ambients may also be employed in the annealing step. It should be noted that in those instances when no metal-nitride cap is employed the annealing process should be preferably conducted in an inert gas ambient.

Figure 1D:
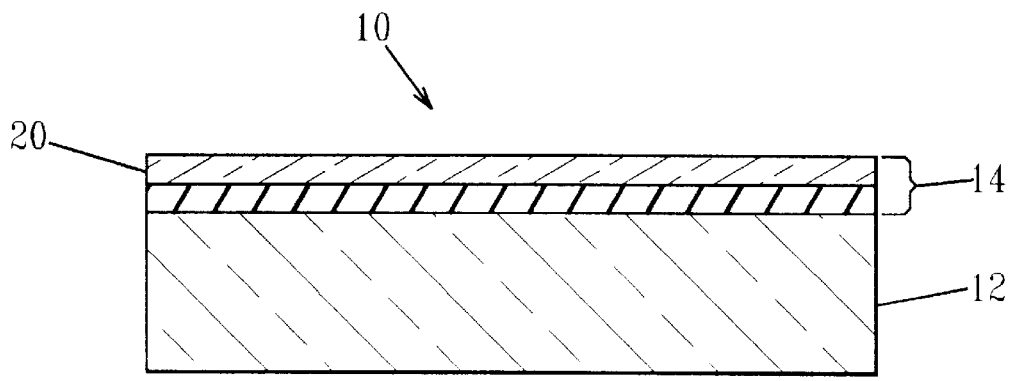

The next step of the method of the present invention which is shown in FIG. 1(d) comprises removing cap 18.

The metal-nitride cap may be removed using techniques well known to those skilled in the art. For example, dry etching or chemical etching techniques may be employed. Suitable dry etching techniques that may be employed to remove cap 18 includes reactive ion etching (RIE), ion beam etching (IBE), laser ablation and the like thereof.

When chemical etching is employed, any etchant known to those skilled in the art which can etch cap 18 may be employed in the present invention. Typical examples of such etchants include, but are not limited to, $H_2O_2$, $NH_4OH$, phosphoric acid, chromic acid, nitric acids and mixtures thereof. The etchants may also be used in combination with a small amount of water. Of the chemical etchants mentioned hereinabove, a mixture comprising $H_2O_2$, $NH_4OH$ and $H_2O$ is highly preferred. The ratio of the components in the preferred mixture is generally about 1:1:5, respectively.

Figure 1E:
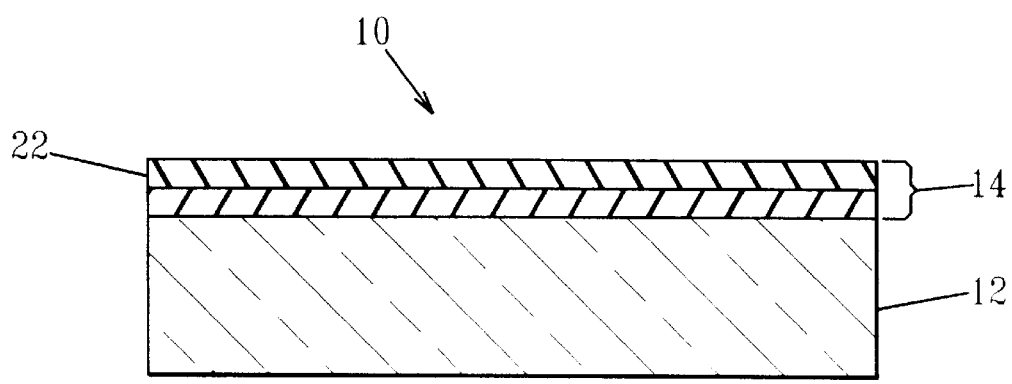

After cap 18 is removed, the composite structure is then oxidized under conditions which are sufficient to convert metal silicide layer 20 to a metal oxide layer 22. When Ti is employed, for example, the titanium silicide layer is converted into a $TiO_2$ layer. The oxidized composite dielectric structure, which represent the final composite dielectric structure of the present invention, is shown in FIG. 1(e).

The oxidization step employed in the present invention comprises a rapid thermal oxidation process which is typically carried out at a temperature of from about 700° to about 1150° C. for a period of time of from about 1 sec. to about 2 mins. More preferably, the annealing step is conducted at a temperature of from about 800° to about 1150° C. for a period of time of from about 30 to about 120 secs. A more preferred method of oxidizing the metal-diffused nitride would be to conduct a wet oxidation process which typically occurs at a temperature of from about 700° to about 1000° C. for a period of time of from about 1 min. to about 1 hr.

As stated above, the method of the present invention is also applicable without the need of employing a metal-nitride cap. In this embodiment of the present invention wherein no metal-nitride cap is employed, annealing of the composite product is conducted in an inert gas ambient and it occurs directly after metal deposition. The composite product may optionally be subjected to an annealing step followed by an in-situ oxidization step prior to conducting the oxidization step. The annealing conditions and temperatures as well as the oxidization parameters employed in this aspect of the present invention are the same as those mentioned previously herein and are such that the metal is allowed to diffuse into the silicon nitride prior to oxidizing the composite.

In accordance with another aspect of the present invention, a composite dielectric material is provided. The composite dielectric material of the present invention comprises a layer of metal oxide such as $TiO_2$ or $Ta_2O_5$ interdiffused into a $Si_3N_4$ layer.

The composite dielectric material of the present invention, has a dielectric constant of from about 8 to about 10 which is higher than $Si_3N_4$ (about 6 to 7).

In accordance with another aspect of the present invention, semiconductor devices such as capacitors, DRAM cells and the like containing the composite dielectric material of the present invention are provided. Such devices containing the composite dielectric material of the present invention are highly suitable for use in advance memory applications. Moreover, the high dielectric composite material of the present invention can be utilized in stack or trench DRAM technologies without the need of using expensive plate or electrode materials which are typically employed when forming $Ta_2O_5$ dielectric composites.

A simple capacitor device contemplated by the present invention comprises a dielectric composite structure prepared in accordance with the method of the present invention formed between a pair of metal or silicon contact layers. Suitable metals which can be used as the contact layers include, but are not limited to, Al, Cr, Cu, W, Ta, Ag, Au and the like thereof. Alloys of the metals with or without Si are also contemplated herein. Of those metals, Al is highly preferred.

The following example is given to illustrate the scope of the present invention. Because this example is given for illustrative purposes only, the invention embodied therein should not be limited thereto.

EXAMPLE

A high dielectric constant $TiO_2$—$Si_3N_4$ composite structure was prepared in accordance with the method of the present invention. Specifically, the $TiO_2$—$Si_3N_4$ composite structure was prepared by first depositing a 75 Å thick $Si_3N_4$ film by LPCVD on top of a silicon semiconductor substrate. A metal stack comprises 100 Å Ti/400 Å TiN was then formed on top of the $Si_3N_4$ layer. The structure thus formed was then annealed using a forming gas anneal process at about 600° C. for about 1 hr. The TiN cap was then removed by etching the annealed product using a 5:1:1 $H_2O/NH_4OH/H_2O_2$ etchant mixture. Next, the etched composite product was subjected to a rapid thermal oxidization process at 1050° C. for 60 secs.

After oxidation, Al dots ranging from about 0.000487 to about 0.196 $cm^2$ were deposited on the frontside and a blanket Al film was deposited on the backside of the wafer for the back contact.

Table I shows the measured capacitance (1 MHZ) and equivalent dielectric constant of a controlled wafer (80 Å±8 Å LPCVD $Si_3N_4$) and the composite dielectric structure of the present invention. The permittivity of the composite dielectric material of the present invention is about 1.5 to 2 times that of the controlled sample.

TABLE 1

| 1 MHZ Dielectric Constant Summary | | | | | |
|---|---|---|---|---|---|
| Sample | Index | Thickness (Å) | $C_{max}$ (pF) | Area ($Cm^2$) | Epsilon |
| Control | 2.00 | 84 | 1538 | 0.007161 | 5.23 |
| Invention | 1.40 | 190 | 5849 | 0.007742 | 8–10 |

Figure 2A:
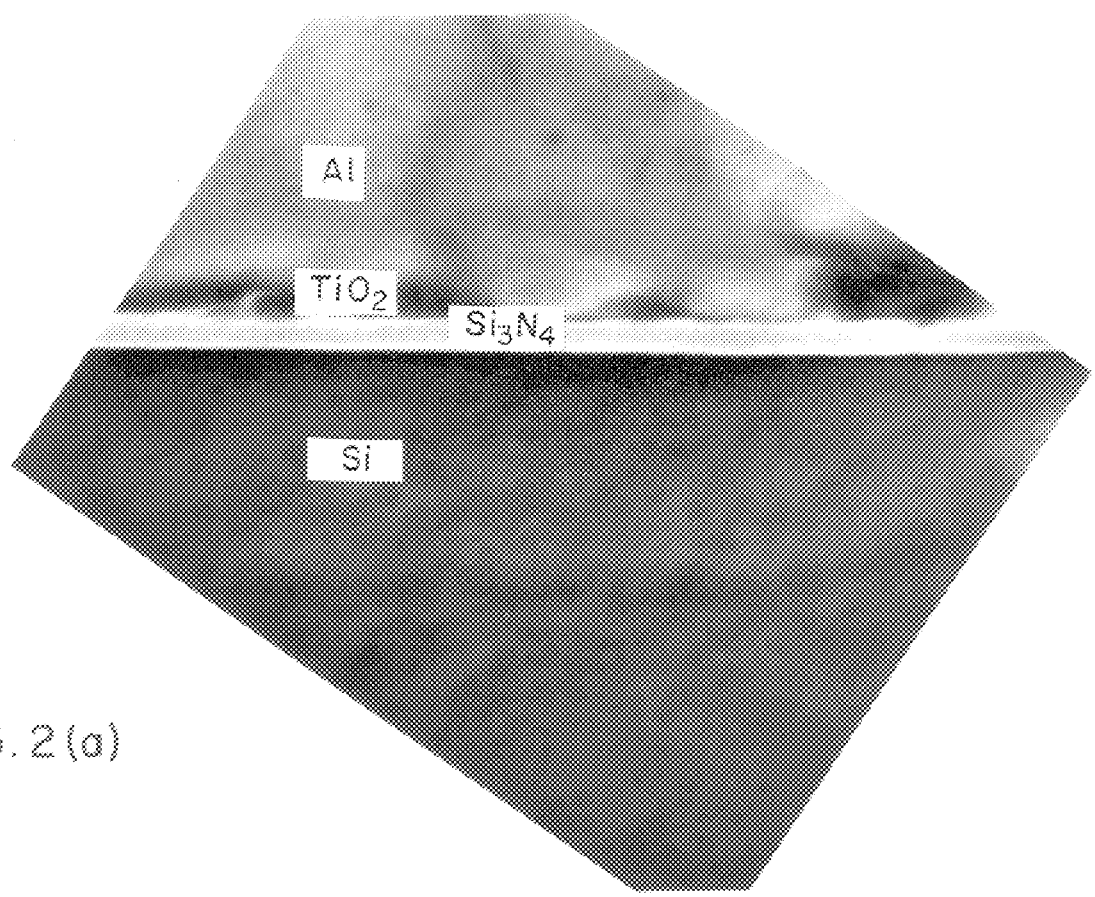
FIGS. 2(a) and (b) are cross-sectional views of a Transmission Electron Micrograph (XTEM) and a plan-view Transmission Electron Micrograph (TEM) of the composite dielectric material produced in Example 1, respectively.
Figure 2B:
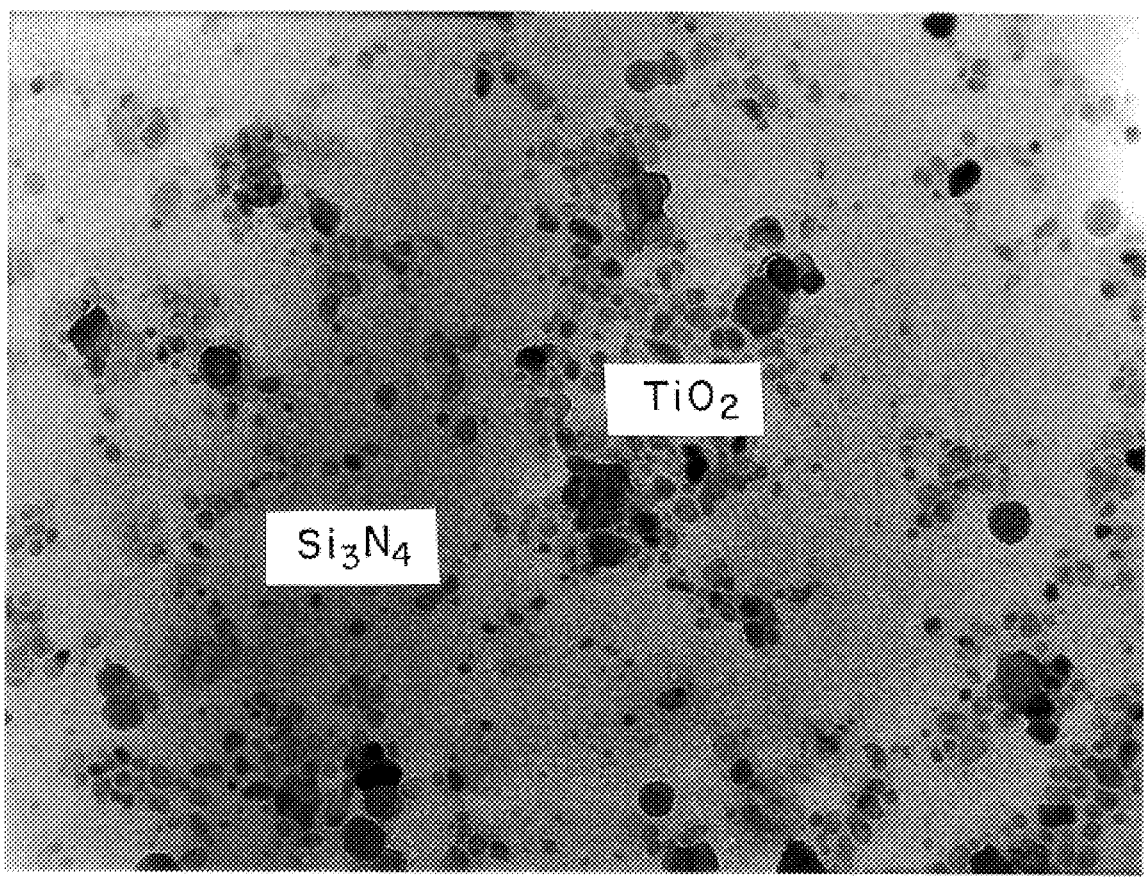

A composite dielectric material of the present invention was then characterized by ellipsometry (refractive index), and TEM (plan-view and X-term). FIG. 2(a) is a XTEM through an Al dot capacitor structure containing the composite dielectric material of the present invention. FIG. 2(b) is a plan-view TEM of the composite dielectric material of the instant invention.

The XTEM of the composite shows a rather uneven composite film thickness, ranging from 80–120 Å. However, there is evidence that the Ti interdiffused into the silicon nitride and which was subsequently oxidized to form $TiO_2$. The XTEM actually reveals 3 layers —(1) a bottom oxide of roughly 10 Å, (2) a nitride film of 50 Å, and (3) a thin "light" constant material of approximately 20–25 Å and 40 Å thick islands of $TiO_2$. The bottom oxide is essentially that of a native oxide which was not removed during the preclean step prior to the nitride deposition. Thus, the 75 Å nitride used for these experiments actually consists of 10 Å oxide and 65 Å nitride. Since 50 Å nitride is observed in FIG. 2(a), it may be inferred that approximately 15 Å of nitride was used to form the $TiO_2$ layers.

Plan-view TEM indicates that the islands of $TiO_2$ are crystalline which are of the high permittivity rutile structure. However, the thin "light" constant material underneath the $TiO_2$ islands is argued to be a $TiO_2$ doped SiN or $TiO_2$ doped $SiO_2$ which also contributes to the high permittivity of the composite film. This conclusion is borne out by three observations. First, the density of "residual" $TiO_2$ grains is not very high (at most 5–10%) and is largely discontinuous. Second, the refractive index that was measured for this particular wafer is 1.40; $TiO_2$ films have a refractive index of 2.20 while $Si_3N_4$ films have a refractive index of 2.00. Third, the thin "lighter" constant material is continuous underneath the Al dot. In fact, this material may account for the dot—dot leakage—2.2 uA at 80V —that was observed for this particular wafer (the control wafer showed only 20 nA at 80V). These characteristics are very similar to a material such as $TiO_2$. $TiO_2$ is somewhat conductive and also has high permittivity (as high as 180).

Figure 3:
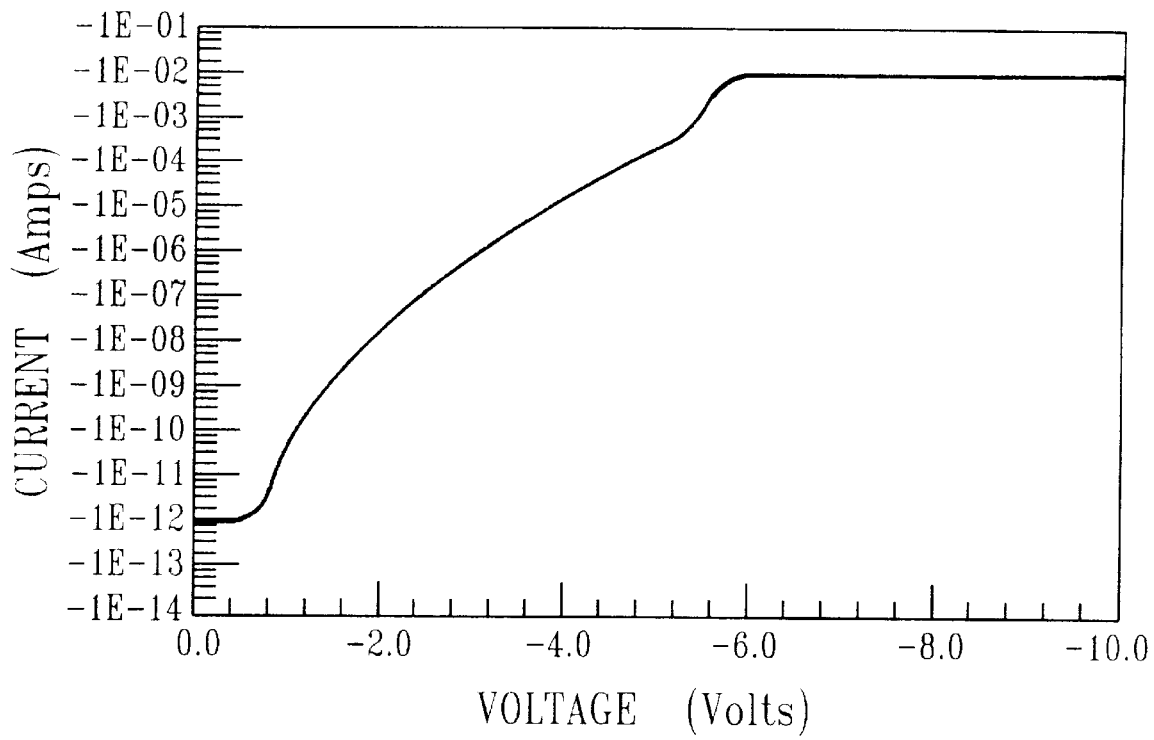
FIGS. 3(a) and (b) are current-voltage (I-V) plots of the composite dielectric material of the present invention produced in Example 1 and that of a controlled sample, respectively.
Figure 3:
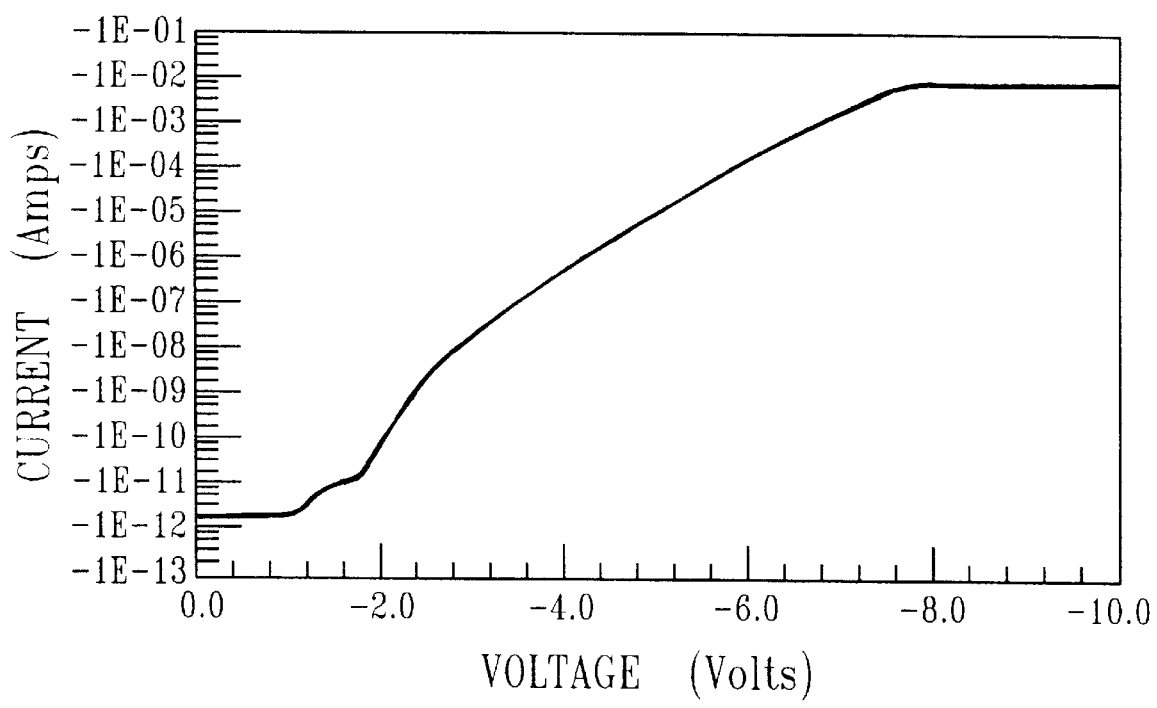

FIG. 3(a) and 3(b) are I-V plots of the $TiO_2$—$Si_3N_4$ composite of the present invention and the control wafer, respectively. The leakage current through the $TiO_2$—$Si_3N_4$ film is only slightly worse than the control wafer. Since the leakage is most likely due to the semiconducting $TiO_2$, one can minimize the leakage further by oxidizing the composite film in a wet furnace oxidation step.

While the invention has been particularly shown and described with respect to preferred embodiments thereof, it will be understood by those skilled in the art that the foregoing and other changes in form and detail may be made therein without departing from the spirit and scope of the invention.

Having thus described our invention, what we claim as new, and desire to secure by Letters Patent is:

1. A method of forming a composite dielectric structure comprising the steps of:
    (a) depositing a $Si_3N_4$ layer on top of a semiconductor substrate;
    (b) forming a metal layer on said $Si_3N_4$ layer;
    (c) annealing the composite formed in step (b) under conditions sufficient to form a metal silicide layer interdiffused into said $Si_3N_4$ layer; and
    (d) oxidizing the composite produced in step (c) under conditions sufficient to convert the metal silicide layer to a layer containing a metal oxide.

2. The method of claim 1 further comprising the steps of providing a metal-nitride cap on said metal layer prior to conducting or during said annealing step and removing said metal-nitride cap prior to conducting said oxidation step.

3. The method of claim 1 wherein said $Si_3N_4$ layer is deposited by chemical vapor deposition.

4. The method of claim 3 wherein said $Si_3N_4$ layer is deposited by low pressure chemical vapor deposition (LPCVD) or plasma-enhanced chemical vapor deposition (PECVD).

5. The method of claim 4 wherein said $Si_3N_4$ layer has a thickness of from about 50 to about 200 Å.

6. The method of claim 5 wherein said $Si_3N_4$ layer has a thickness of from about 50 to about 100 Å.

7. The method of claim 1 wherein said semiconductor substrate is composed of silicon.

8. The method of claim 1 further including cleaning the semiconductor substrate prior to depositing said $Si_3N_4$ layer.

9. The method of claim 8 wherein said cleaning step comprises etching said semiconductor substrate under conditions which are sufficient to remove native oxides which are present in said semiconductor substrate and nitridizing the etched semiconductor substrate.

10. The method of claim 2 wherein said metal layer and said metal-nitride cap are composed of at least one metal selected from the group consisting of Ti, Ta, Ba, Sr, Zr, Hf, Nb, V, Pb, Cr and alloys thereof.

11. The method of claim 10 wherein said metal layer and said metal-nitride cap are composed of Ti.

12. The method of claim 2 wherein said metal layer and said metal-nitride cap are formed by sputtering, chemical vapor deposition or ion implantation.

13. The method of claim 12 wherein said metal layer and said metal-nitride cap are formed by sputtering or chemical vapor deposition.

14. The method of claim 1 wherein said metal layer has a thickness of from about 50 to about 500 Å.

15. The method of claim 14 wherein said metal layer has a thickness of from about 50 to about 300 Å.

16. The method of claim 2 wherein said metal-nitride cap has a thickness of from about 50 to about 1000 Å.

17. The method of claim 16 wherein said metal-nitride cap has a thickness of from about 50 to about 500 Å.

18. The method of claim 1 wherein said annealing step is conducted at a temperature of from about 400° to about 800° C. for a period of time of from about 1 min. to about 1 hr.

19. The method of claim 18 wherein said annealing step is conducted at a temperature of from about 500° to about 800° C. for a period of time of from about 1 min. to about 1 hr.

20. The method of claim 2 wherein said annealing step is conducted in a $H_2$, $N_2$ or a mixture thereof.

21. The method of claim 1 wherein said annealing step is conducted in an inert gas ambient, wherein said inert gas is selected from the group consisting of He, Ne, Ar and Xe.

22. The method of claim 21 wherein following said annealing step the composite is annealed and then oxidized in-situ.

23. The method of claim 1 wherein said metal silicide layer is composed of $Ti_5Si_3$.

24. The method of claim 2 wherein said removal step includes dry etching or chemical etching.

25. The method of claim 24 wherein said dry etching includes reactive ion etching (RIE), ion beam etching (IBE) or laser ablation.

26. The method of claim 24 wherein said chemical etching is conducted using a chemical etchant selected from the group consisting of $H_2O_2$, $NH_4OH$, phosphoric acid, chromic acid, nitric acid and mixtures thereof.

27. The method of claim 26 wherein said chemical etchant is a mixture of $H_2O_2$, $NH_4OH$ and $H_2O$.

28. The method of claim 1 wherein said oxidation step comprises a rapid thermal oxidization process.

29. The method of claim 28 wherein said rapid thermal oxidization process is carried out at a temperature of from about 700° to about 1150° C. for a period of time of from about 1 sec. to about 1 min.

30. The method of claim 29 wherein said rapid thermal oxidization process is carried out at a temperature of from about 800° to about 1150° C. for a period of time of from about 30 to about 120 secs.

31. The method of claim 1 wherein the oxidation step is a wet-oxidation process which is carried out at a temperature of from about 700° to about 1000° C. for a period of time of from about 1 min. to about 1 hr.

* * * * *